US006875686B2

(12) United States Patent
Demolliens et al.

(10) Patent No.: US 6,875,686 B2
(45) Date of Patent: Apr. 5, 2005

(54) METHOD FOR FABRICATING A STRUCTURE OF INTERCONNECTIONS COMPRISING AN ELECTRIC INSULATION INCLUDING AIR OR VACUUM GAPS

(75) Inventors: Olivier Demolliens, St Egreve (FR); Pascale Berruyer, Vauhnaveys (FR); Yorick Trouiller, Grenoble (FR); Yves Morand, Grenoble (FR)

(73) Assignee: Commissariat A l'Energie Atomique, Paris (FR)

(*) Notice: Subject to any disclaimer, the term of this patent is extended or adjusted under 35 U.S.C. 154(b) by 76 days.

(21) Appl. No.: 10/168,949

(22) PCT Filed: Dec. 28, 2000

(86) PCT No.: PCT/FR00/03713
§ 371 (c)(1),
(2), (4) Date: Oct. 3, 2002

(87) PCT Pub. No.: WO01/50524
PCT Pub. Date: Jul. 12, 2001

(65) Prior Publication Data
US 2003/0077893 A1 Apr. 24, 2003

(30) Foreign Application Priority Data
Dec. 29, 1999 (FR) .............................. 99 16637

(51) Int. Cl.[7] .................. H01L 21/4762; H01L 21/3205
(52) U.S. Cl. ....................................... 438/622; 438/586
(58) Field of Search ................................ 438/622, 586, 438/626, 585, 592, 638, 687; 257/E21.579, E21.581

(56) References Cited

U.S. PATENT DOCUMENTS

| 5,559,055 A | 9/1996 | Chang et al. ................ 437/195 |
| 5,953,626 A | 9/1999 | Hause et al. ................. 438/622 |
| 6,071,805 A | * 6/2000 | Liu ............................. 438/619 |
| 6,165,890 A | * 12/2000 | Kohl et al. .................. 438/619 |

FOREIGN PATENT DOCUMENTS

| FR | 2 770 028 | 4/1999 | ......... H01L/21/768 |
| GB | 2 330001 | 4/1999 | ......... H01L/21/768 |
| JP | 10/233449 | 2/1998 | ......... H01L/21/768 |

* cited by examiner

Primary Examiner—Craig A. Thompson
(74) Attorney, Agent, or Firm—Thelen Reid & Priest LLP

(57) ABSTRACT

The invention concerns a method for fabricating a damascene type structure of interconnections on a semiconductor device. It includes the following steps:
  formation of a first level of conductors in a first electric insulating layer and of a second level of conductors in a second electric insulating layer, with the conductors in the first level being arranged with a pre-determined spacing in order to allow, in a later step, the formation of air or vacuum gaps between the conductors in the first level,
  elimination of the second electric insulating layer,
  elimination, at least partial, of the first electric insulating layer in order to eliminate at least some parts of the first layer corresponding to the gaps to be formed,
  deposit, over the structure thus obtained, of a material with low permittivity, with this deposit not filling the space between the conductors in the first level whose spacing has been planned to allow the formation of gaps.

10 Claims, 5 Drawing Sheets

US 6,875,686 B2

METHOD FOR FABRICATING A STRUCTURE OF INTERCONNECTIONS COMPRISING AN ELECTRIC INSULATION INCLUDING AIR OR VACUUM GAPS

TECHNICAL FIELD

The present invention concerns a method for fabricating a structure of damascene type interconnections on a semiconductor device. The structure of interconnections includes an electric insulation associating some low permittivity material and some air or vacuum gaps.

PRIOR STATE OF THE ART

The building of ever denser integrated circuits requires the building of ever more efficient interconnections from the point of view of resistance for the electric connection metal lines and the capacity of the insulations between the metals. In order to reduce this resistance and this capacity (cutting down the RC delays and the effects of cross-coupling), it is necessary to make the materials used evolve towards metal materials with a low resistivity for the conductor elements and towards dielectric materials with a low constant dielectric for the insulating materials. Thus, aluminium tends to be replaced by copper and the classic dielectric materials used such as $SiO_2$, $Si_xN_y$, $SiO_xN_y$ tend to be replaced by materials of the type that are doped with fluorine (FSG, for example), methylsilsesquioxane (MSQ), hydrogen silsesquioxane (HSQ), organic materials (ECB, Silk, Flare, PAE, etc . . . ), porous materials (NanoGlass, for example), etc . . . For dielectric materials, the latest limit is the use of vacuum or of air. It is the control of this latest kind of insulation which currently poses a problem.

The use of air or a vacuum as a final insulation for interconnections has been described in the article entitled "A Novel Air Gap Integration Scheme for Multi-level Interconnects using Self-aligned Via Plugs", by T. UEDA and which was published in the 1998 Symposium on VLSI Technology, Digest of Technical Papers (IEEE, 1998). This document describes the use of procedures for depositing a low filling capacity or bad conformity dielectric. This technique is applied to the realization of conventional interconnections, with the lines and the metal contacts being produced by depositing a metal such as aluminium or tungsten, with the metal that has been deposited then being etched, which is why it is therefore incompatible with copper interconnections, since this metal is difficult to cut.

The document EP-A-0 834 916 also publishes the use of air gaps to realize a structure for enhanced performance interconnections (damascene structure). The technique published by this document may not however be used when the structure includes expanded contacts, that is to say, interconnections in which the metal contacts (or vias) linking an n-level metal to the higher level n+1 metal may be of a larger size than the n-level metal lines or positioned overlapping the n-level metal. In effect, in this case, which will be illustrated in FIGS. 1A to 1C, the air or vacuum gaps are formed before etching the holes which will allow you to connect the n-level metal to the n+1 level metal. Therefore, these holes will emerge over the gaps, which makes it impossible for them to be filled by a metal afterwards.

FIG. 1A shows a simple damascene structure, already familiar in the state of the art, formed on one side 2 of a semiconductor substrate 1. The side 2 is covered by a first layer of dielectric material 3, with the latter being covered by a second layer of dielectric material 4 meant to house copper lines 5. The realization method leaves gaps 6 in place that are meant to trap the air.

A third layer of dielectric material 7 is deposited on the structure allowing some small-sized gaps 6 to remain. This is shown in FIG. 1B.

FIG. 1C shows the structure after some holes 8 have been made in the dielectric material layer 7 for housing the vias, which turn out to be expanded contacts. The holes 8 pose a problem due to the fact that they finish above the gaps. Their filling for producing the expanded contacts, especially, poses a problem.

Document EP-A-0 834 916 also publishes the method for producing an electric insulation using some dielectric materials with low permittivity (less than 2.7) for damascene type interconnection structures. The interconnections are first made with an insulator with a permittivity lower than 3.5, which is then removed and replaced by an insulator with a permittivity lower than 2.7 (chosen from amongst HSQ, BCB, a polymide and PAE). This realization method poses some serious problems of planarisation: good planarisation in the regions with heavy density of metal, bad planarisation on the insulated metal lines. Furthermore, this method means losing all the advantages offered by the damascene technology.

SUMMARY OF THE INVENTION

The present invention has been designed to solve the problems described above. It allows electric insulations to be to made for metal interconnections realized in damascene technology covering a combination of gaps (trapping air or a vacuum), dielectric materials with low permittivity (less than 3) and $SiO_2$, $Si_xN_y$, $SiO_xN_y$ and SiOF type materials. These electric insulations are compatible with metal contacts linking an n level metal to the n+1 level metal, and these metal contacts may be of a larger size than the n level metal lines or positioned overlapping the n level metal and the adjacent dielectric. This procedure also allows for perfect planarisation of the interconnections.

Therefore the purpose of the invention is a method for fabricating a damascene type structure of interconnections on a semiconductor device, with the interconnections structure including at least a first level of conductors covered by a second level of conductors aimed at ensuring electrical links with the conductors on the first level, with the interconnections structure also including an electric insulation associating some material with low permittivity and some air or vacuum gaps, characterised by the fact that it includes the following steps:

formation of the first level of conductors in a first electric insulating layer and of the second level of conductors in a second electric insulating layer, with the conductors in the first level being arranged with a pre-determined spacing in order to allow, in a later step, the formation of air or vacuum gaps between the conductors in the first level, elimination of the second electric insulating layer, elimination, at least partial, of the first electric insulating layer in order to remove at least some parts of the first layer corresponding to the air or vacuum gaps to be formed, deposit, over the structure thus obtained, of a material with low permittivity, with this deposit not filling the space between the conductors in the first level whose spacing has been planned to allow the formation of air or vacuum gaps.

If the deposit of material with low permittivity covers the conductors on the second level, a planarisation step may be envisaged to reveal these conductors.

The electric insulation layers may be layers made of a material chosen between $SiO_2$ and SiOF.

Advantageously, the method includes the deposit of an interface layer made of an insulating material on the semiconductor device before the formation of the first level of conductors, and the deposit of an interface layer on the first level of conductors before the formation of the second level of conductors. The insulating material in the interface layer deposited on the semi-conductor device may be chosen from amongst $Si_xN_y$, $SiO_xN_y$ and SiC. The interface layer separating the first level of conductors from the second level of conductors may be made of a material selected from amongst $Si_xN_y$, $SiO_xN_y$ and SiC.

According to a specific embodiment for realizing the invention, the method includes, after the elimination of the second electric insulating layer, the complete elimination of the interface layer separating the first level of conductors from the second level of conductors and the complete elimination of the first electric insulating layer.

According to another specific embodiment for realizing the invention, the method includes, after the elimination of the second electric insulating layer, the deposit of a layer of resin on the interface layer deposited on the first level of conductors, the formation of a mask made up by the layer of resin with a view to performing the partial elimination of the of the first electric insulating layer, the elimination of the part of the interface layer deposited on the first level of conductors and not masked by the resin mask, then the step for the elimination of the first electric insulating layer may be undertaken.

Advantageously, the conductors in the first level of conductors and the conductors in the second level of conductors are made of copper or based on copper.

BRIEF DESCRIPTION OF THE DRAWINGS

The invention will be understood better and some other advantages and particular details will appear when reading the description which follows, provided for the purposes of an example but not limited thereto, accompanied by the attached drawings, amongst which.

DETAILED DESCRIPTION OF THE EMBODIMENTS OF THE INVENTION

FIGS. 2A to 2F illustrate a first mode for implementing the invention based on a silicon substrate.

Figure 1A:
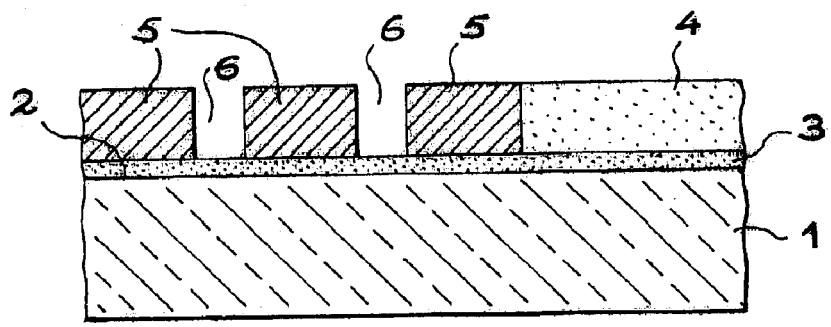
FIGS. 1A to 1C, already described, are cross-section views of a damascene type structure of interconnections, in accordance with the state of the art as it is known, during the course of its realization.
Figure 1B:
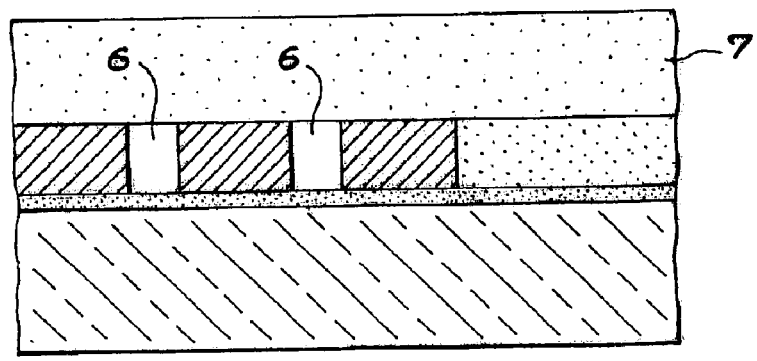
Figure 1C:
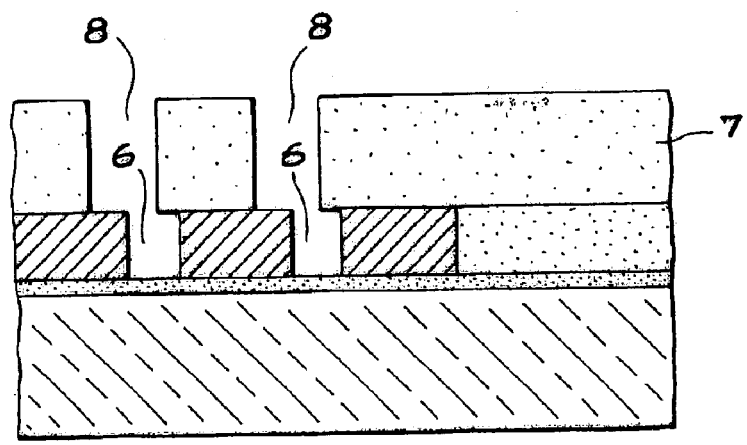
Figure 2A:
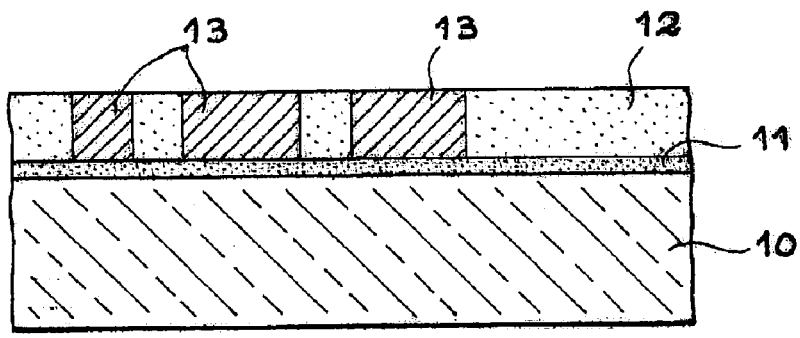
FIGS. 2A to 2F are cross-section views of a damascene type structure of interconnections during the course of its realization, in accordance with a first embodiment of the invention.

FIG. 2A shows a substrate 10 made of silicon covered by an interface layer 11, for example, made of $Si_xN_y$, $SiO_xN_y$ or SiC and a first electric insulating layer 12, for example, made of $SiO_2$ or SiOF. Layers 11 and 12 may be deposited using techniques that are well-known by an expert in the state of the art. In an equally well-known manner, some conducting lines 13, for example, made of copper, are formed in the first electric insulating layer 12. The spacing between the conducting lines 13, or at least between certain conducting lines 13, is planned to allow, in a subsequent step, the formation of air or vacuum gaps between these lines.

Figure 2B:
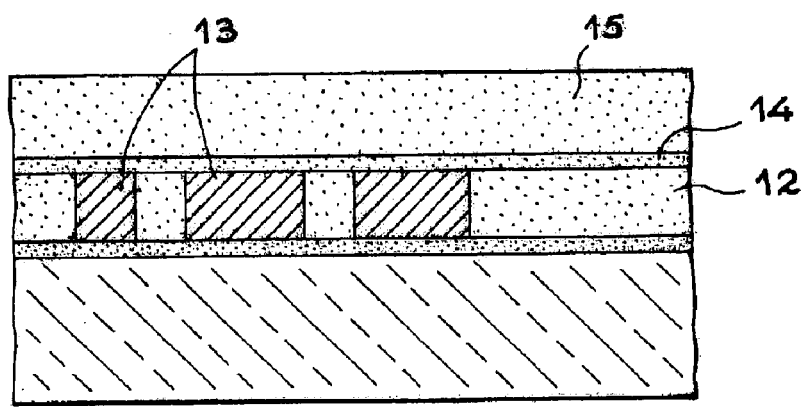

As shown in FIG. 2B, an interface layer 14, for example, made of $Si_xN_y$ or $SiO_xN_y$ or SiC, is deposited on the first electric insulating layer 12 integrating the conducting lines 13. On the interface layer 14, a second electric insulating layer 15 is deposited, for example, made of $SiO_2$ or SiOF. These deposits of layers are performed using methods that are well-known by an expert in the state of the art.

Some conducting vias 16, for example, made of copper, are then formed across the second electric insulating layer 15 and the interface layer 14. Thus the conducting vias 16 ensure an electric link with the conducting lines 13.

The conducting lines and the conducting vias may include some barrier layers, for example, made of TiN, Ta, TaN, W or WN.

According to this first embodiment of the invention, the second electric insulating layer, 15, the interface layer 14 and the first electric insulating layer 12 are eliminated. Thus the structure shown in FIG. 2D is obtained.

A dielectric material 17 with low permittivity is deposited on this structure, a material known as a low-k (permittivity less than 3): for example, a polymer, SiOC, a porous dielectric material (for example, a material from the Nano-glass trademark), HSQ. The material 17 may be deposited by spreading or by chemical vapour deposition (CVD). It may involve, in this case, material with a high level of viscosity, a polymer with a long monomer chain. Some adapted deposit methods may also be used (PECVD, etc . . . ), which leave gaps in the small-sized spaces between the metals. FIG. 2E shows this step of the method and especially shows the presence of gaps 18 between the conducting lines 13. This Figure also shows that the conducting vias 16 are covered by the dielectric material 17.

Then a cutting or chemical-mechanical polishing process (CMP) is applied to eliminate the excess dielectric material 17 and to reveal the vias 16 as well as to planarise the structure. This planarisation is all the easier because it only involves the dielectric material.

FIGS. 3A to 3D illustrate a second embodiment of the invention based on a silicon substrate.

Figure 2C:
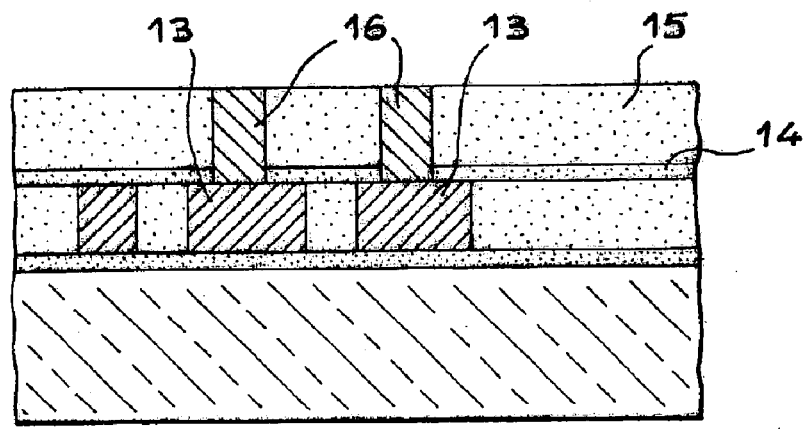
Figure 2:
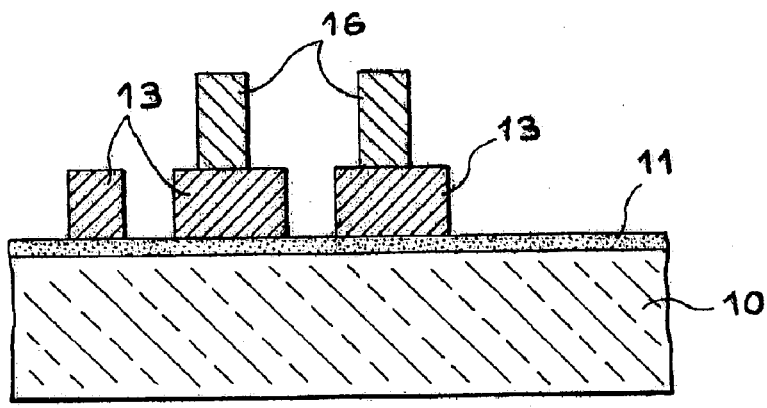
Figure 2:
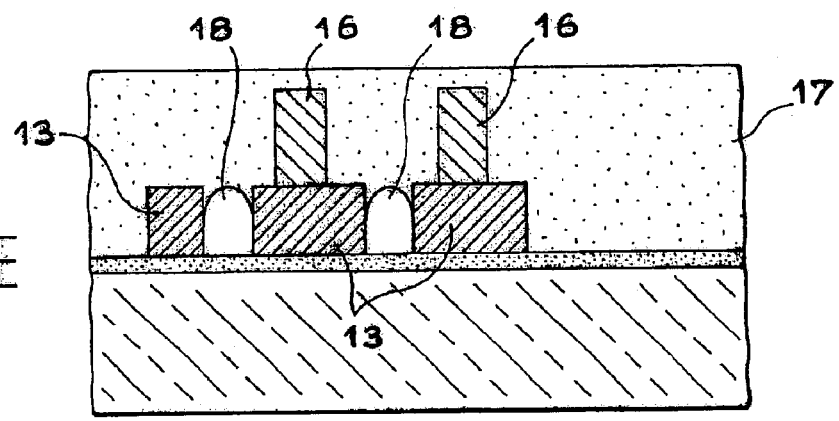
Figure 2:
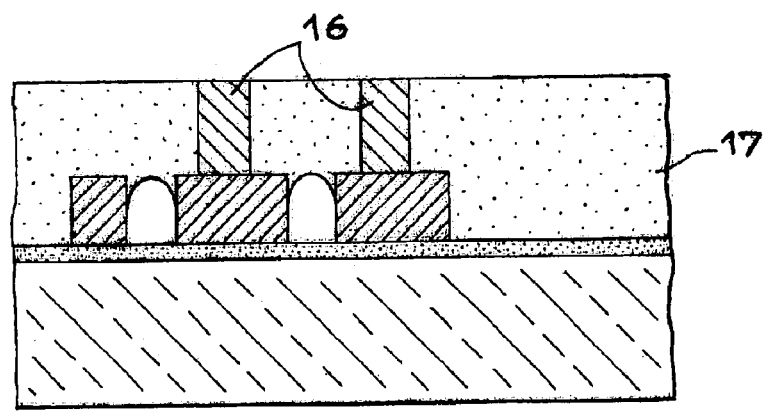

The first steps of this second embodiment are identical to those illustrated in FIGS. 2A to 2C. Therefore they shall not be shown.

Figure 3:
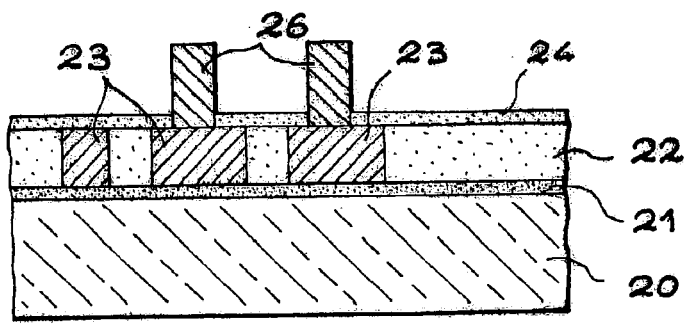
FIGS. 3A to 3D are cross-section views of a damascene type structure of interconnections during the course of its realization, in accordance with a second embodiment of the invention.
Figure 3:
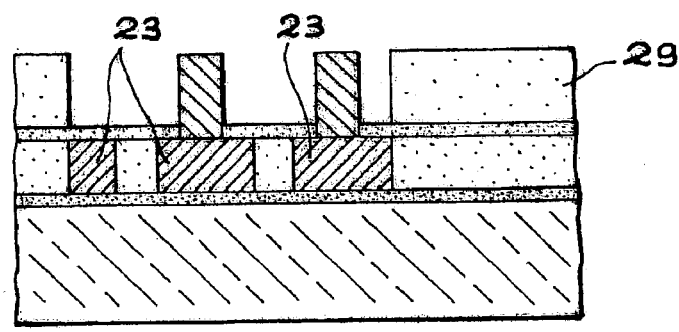
Figure 3:
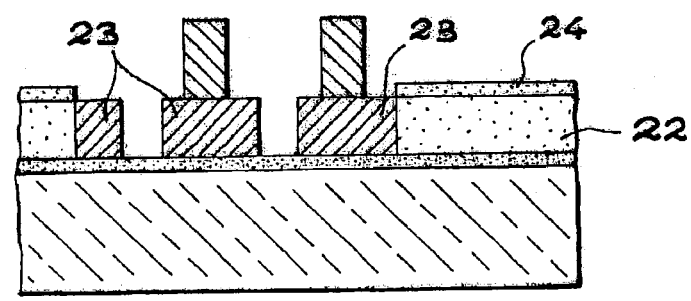
Figure 3:
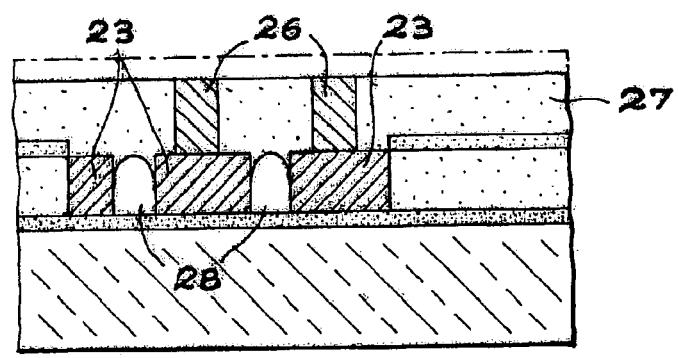

FIG. 3A shows the structure obtained after the elimination of the second electric insulating layer. As a variation, the interface layer located between the two layers of electric insulation could also be eliminated. The substrate 20 supports an interface layer 21, and the latter itself is covered by the first electric insulating layer 22 integrating the conducting lines 23. The interface layer 24 covers this first level of conductors, with the conducting vias 26 thereby ensuring the electric link with some conducting lines 23.

A layer of photosensitive resin is then deposited on the structure to form, by lithography, a mask 29 protecting the areas where the spaces between the lines 23 are large, for example, over 0.5 µm (see FIG. 3B).

The areas in the interface layer 24 and the first electric insulating layer 22 not protected by the resin mask 29 are eliminated. These areas correspond to the places in the structure where the conducting lines 23 are arranged closely (for example, with a spacing of less than 0.5 µm). The result obtained is illustrated in FIG. 3C.

A dielectric material 27 with low permittivity and with a low capacity for filling is deposited on this structure. Then, as shown in FIG. 3D, some gaps 28 are formed between the conducting lines 26 that are very slightly separated. The conducting vias 26, which were initially covered by the dielectric material 27 whose upper level is shown with dot and dash lines, are exposed following a method for etching or chemical and mechanical polishing the excess dielectric material 27.

In the case of this second embodiment of the invention, it is not necessary for the elimination of the excess dielectric material to make it even. In effect, the fact of leaving the first electric insulating layer 22 in the metal zones that are not dense allows a good level of evenness to be maintained for the structure after the deposit of the dielectric material 27 with low permittivity. At the time of the deposit of the dielectric material 27, the structure is already almost flat apart from the conducting vias 26 which stand out slightly and the spaces between the metals. Planarisation is made much easier by this fact.

Figure 4:
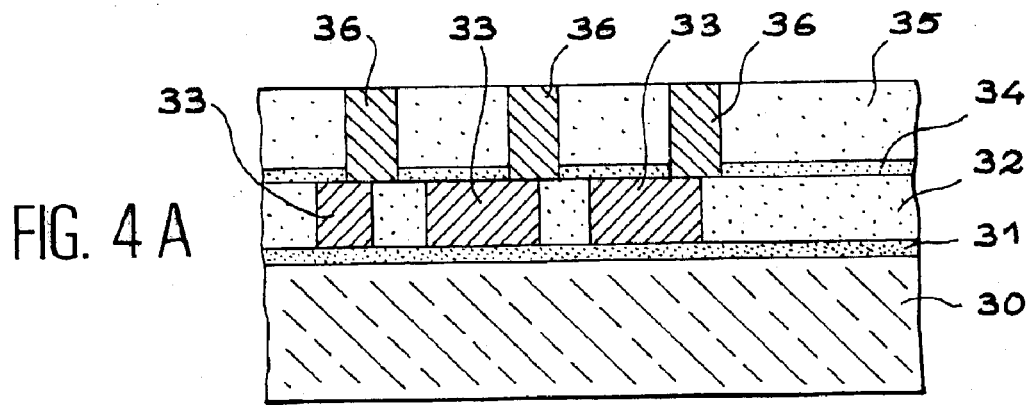
FIGS. 4A to 4C are cross-section views of a damascene type structure of interconnections with expanded contacts and during the course of its realization, in accordance with the first embodiment of the invention.
Figure 4:
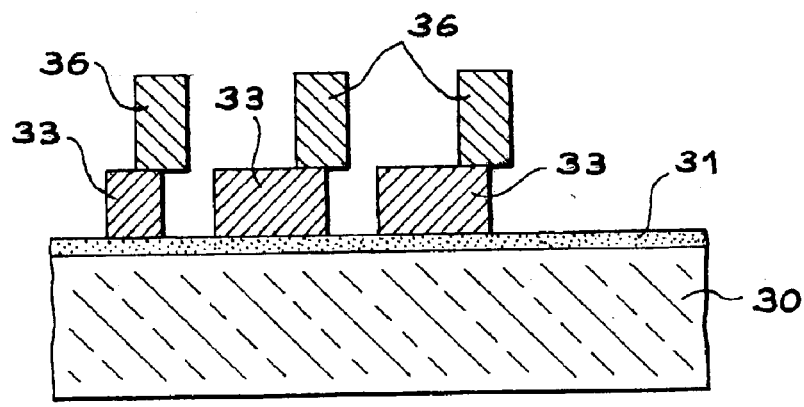
Figure 4:
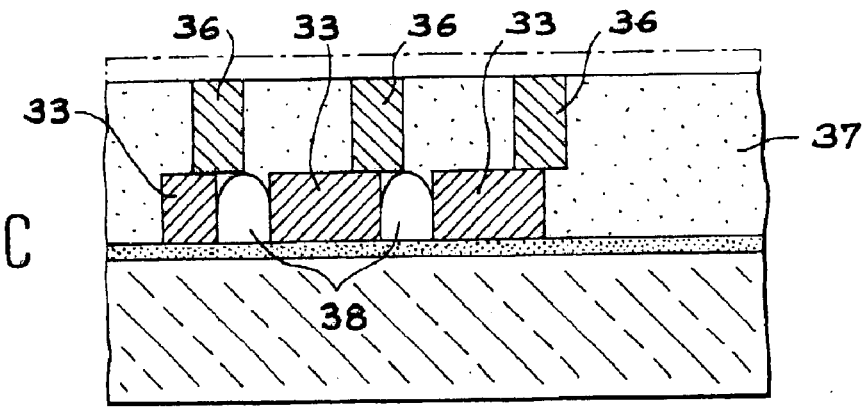

FIGS. 4A to 4C illustrate the production of a damascene type structure of interconnections with expanded contacts, according to the first embodiment of the invention.

The first steps in the realization method are identical to those illustrated in FIGS. 2A to 2C, with the exception of the position of the vias. The structure obtained in this step is the one shown in FIG. 4A. The substrate 30 supports an interface layer 31, the latter itself is covered by the first electric insulating layer 32 integrating the conducting lines 33. The interface layer 34 covers this first level of conductors and supports the second electric insulating layer 35 integrating the conductor vias 36 thereby ensuring the electric link to the conductor lines 33.

In accordance with the first embodiment of the invention, the second electric insulating layer 35, the interface layer 34 and the first electric insulating layer 32 are eliminated. The structure shown in FIG. 4B is obtained.

A dielectric material 37 with low permittivity and a low capacity for filling is obtained. Then, as shown in FIG. 4C, some gaps 38 are formed between the conductor lines 33 which are arranged very closely together. The expanded contacts 36, initially covered by the dielectric material 37 whose upper level is represented by dot and dash lines, are exposed following an etching or chemical and mechanical polishing process to remove the excess dielectric material 37.

Therefore, the invention allows structures with expanded contacts to be produced, since the formation of the gaps is performed after the production of the vias.

Amongst other advantages, the invention allows:

the production of insulation barriers between the metals including both vacuum or air, dielectric materials with low permittivity (less than 3) and mineral type dielectric materials ($SiO_x$, $Si_xN_y$ or $SiO_xN_y$, SiOF, . . . );

the compatibility of this insulation with the making of contact holes unaligned with respect to the metal underlying (overflowing vias);

vacuum or air gaps to be obtained in the areas where the spaces between the metals are the smallest (for example, less than 0.5 $\mu$m), that is to say where it is really necessary to have a dielectric material with very low permittivity whilst preserving a dielectric with very low permittivity in the other areas;

the production of insulations between the metals by leaving a mineral dielectric (for example, $SiO_2$, SiOF, . . . ) in the areas where the spaces between the metals are large (for example, over 0.5 $\mu$m), which makes the deposit of the dielectric with very low permittivity easier (there is no more problem with planarisation since only the vias stand out), enhances the mechanical performance of the insulating material (bearing in mind the better mechanical performance of mineral type dielectric materials with respect to the carbon-based materials) and enhances the behaviour of the device from the point of view of heat dissipation (better levels of heat conductibility of the mineral dielectric materials with respect to the materials with very low permittivity, generally speaking).

What is claimed is:

1. Method for fabricating a damascene type structure of interconnections on a semi-conductor device, with the structure of interconnections including at least a first level of electric conductors covered by a second level of electric conductors ensuring some electric links with the electric conductors in the first level, the structure of interconnections including an electric insulation associating the material with low electric permittivity and the air or vacuum gaps, with the procedure including the following, successive steps:

formation of the first level of electric conductors in a first electric insulating layer and of the second level of electric conductors in a second electric insulating layer, with the electric conductors in the first level being arranged with a predetermined spacing in order to allow, in a later step, the formation of air or vacuum gaps between the electric conductors in the first level, elimination of the second electric insulating, layer, elimination, at least partial, of the first electric insulating layer in order to eliminate at least some parts of the first layer corresponding to the air or vacuum gaps to be formed, deposit, over the structure thus obtained, of a material with low permittivity, with this deposit not filling die space between the electric conductors in the first level, whose spacing has been planned to allow the formation of air or vacuum gaps.

2. Method according to claim 1, in which the deposit of material with low electric permittivity covering the second level electric conductors, the procedure includes a subsequent planarisation step to reveal these electric conductors.

3. Method according to claim 1, in which the first electric insulating layer is a layer made of a material chosen between $SiO_2$ and SiOF.

4. Method according to claim 1, in which the second electric insulating layer is a layer made of a material chosen between $SiO_2$ and SiOF.

5. Method according to claim 4, including the deposit of an interface layer made of an insulating material on the semi-conductor device before the formation of the first level of electric conductors and the deposit of a second interface layer on the first level of electric conductors before the formation of the second level of electric conductors.

6. Method according to claim 5, in which the insulating material in the first interface layer is chosen between SiNy, SiO, Ny and SiC.

7. Method according to claim 5, in which the second interface layer is made of a material chosen from SiNy, SiO, Ny and SiC.

8. Method according to claim 5 including, after the elimination of the second electric insulating layer, the complete elimination of the second interface layer and the complete elimination of the first electric insulating layer.

9. Method according to claim 5, including, after the elimination of the second electric insulating layer and before the step for the elimination, at least partial, of the first electric insulating layer, the deposit of a layer of resin on the interface layer deposited on the first level of electric conductors, the formation of a mask based on the resin layer, the elimination of the part of part of the interface layer deposited on the first level of electric conductors and not masked by the resin mask.

10. Method according to claim 1, in which the electric conductors in the first level of electric conductors and the electric conductors in the second level of electric conductors are made of copper or include some copper.

* * * * *